(12) United States Patent
McLenaghan

(10) Patent No.: US 6,881,074 B1
(45) Date of Patent: Apr. 19, 2005

(54) ELECTRICAL CIRCUIT ASSEMBLY WITH MICRO-SOCKET

(75) Inventor: Allen James McLenaghan, North Kingstown, RI (US)

(73) Assignee: Cookson Electronics, Inc., Foxborough, MA (US)

( * ) Notice: Subject to any disclaimer, the term of this patent is extended or adjusted under 35 U.S.C. 154(b) by 0 days.

(21) Appl. No.: 10/673,652

(22) Filed: Sep. 29, 2003

(51) Int. Cl.[7] .............................................. H01R 12/00
(52) U.S. Cl. ...................................................... 439/70
(58) Field of Search ........................... 439/70, 69, 264, 439/330, 68, 249, 265

(56) References Cited

U.S. PATENT DOCUMENTS

| | | |
|---|---|---|
| 3,526,867 A | 9/1970 | Keeler, II |
| 3,585,569 A | 6/1971 | Moran |
| 3,825,876 A | 7/1974 | Damon et al. |
| 4,526,429 A | 7/1985 | Kirkman |
| 4,601,526 A | 7/1986 | White et al. |
| 4,657,336 A | 4/1987 | Johnson et al. |
| 4,746,300 A | 5/1988 | Thevenin |
| 4,950,173 A | 8/1990 | Minemura et al. |
| 5,046,972 A * | 9/1991 | Pass ............................ 439/751 |
| 5,059,130 A | 10/1991 | Miller, Jr. |
| 5,110,298 A | 5/1992 | Dorinski et al. |
| 5,299,939 A | 4/1994 | Walker et al. |
| 5,312,456 A | 5/1994 | Reed et al. |
| 5,411,400 A | 5/1995 | Subrahmanyan et al. |
| 5,439,162 A | 8/1995 | George et al. |
| 5,457,610 A | 10/1995 | Bernardoni et al. |
| 5,479,105 A | 12/1995 | Kim et al. |
| 5,561,594 A | 10/1996 | Wakefield |
| 5,634,267 A | 6/1997 | Farnworth et al. |
| 5,665,654 A | 9/1997 | Stansbury |
| 5,677,203 A | 10/1997 | Rates |
| 5,746,608 A * | 5/1998 | Taylor .......................... 439/70 |
| 5,772,451 A | 6/1998 | Dozier, II et al. |
| 5,774,341 A | 6/1998 | Urbish et al. |
| 5,903,059 A | 5/1999 | Bertin et al. |
| 5,917,707 A | 6/1999 | Khandros et al. |
| 6,093,053 A | 7/2000 | Horioka et al. |
| 6,166,556 A | 12/2000 | Wang et al. |
| 6,179,625 B1 | 1/2001 | Davis et al. |
| 6,200,143 B1 | 3/2001 | Haba et al. |
| 6,214,642 B1 | 4/2001 | Chen et al. |
| 6,247,938 B1 | 6/2001 | Rathburn |
| 6,345,991 B1 | 2/2002 | Daoud |

(Continued)

Primary Examiner—Ross Gushi
(74) Attorney, Agent, or Firm—Senniger Powers

(57) ABSTRACT

An assembly of the present invention has an integrated circuit device electrically and mechanically connected to the substrate. At least one electrically conductive connecting element is on one of the substrate and circuit device and at least one socket is on the other of the substrate and circuit device. The socket receives the at least one connecting element and comprises at least two resilient members. The resilient members are biased against the connecting element so that the circuit device and the substrate are held in electrical and mechanical connection by the biasing force of the resilient members against the connecting element.

40 Claims, 9 Drawing Sheets

U.S. PATENT DOCUMENTS

| | | |
|---|---|---|
| 6,352,436 B1 | 3/2002 | Howard |
| 6,396,711 B1 | 5/2002 | Degani et al. |
| 6,427,899 B1 | 8/2002 | Hembree et al. |
| 6,450,839 B1 | 9/2002 | Min et al. |
| 6,492,737 B1 * | 12/2002 | Imasu et al. .............. 257/778 |
| 6,493,932 B1 | 12/2002 | Haba |
| 6,560,861 B1 | 5/2003 | Fork et al. |
| 2002/0164893 A1 | 11/2002 | Mathieu et al. |

* cited by examiner

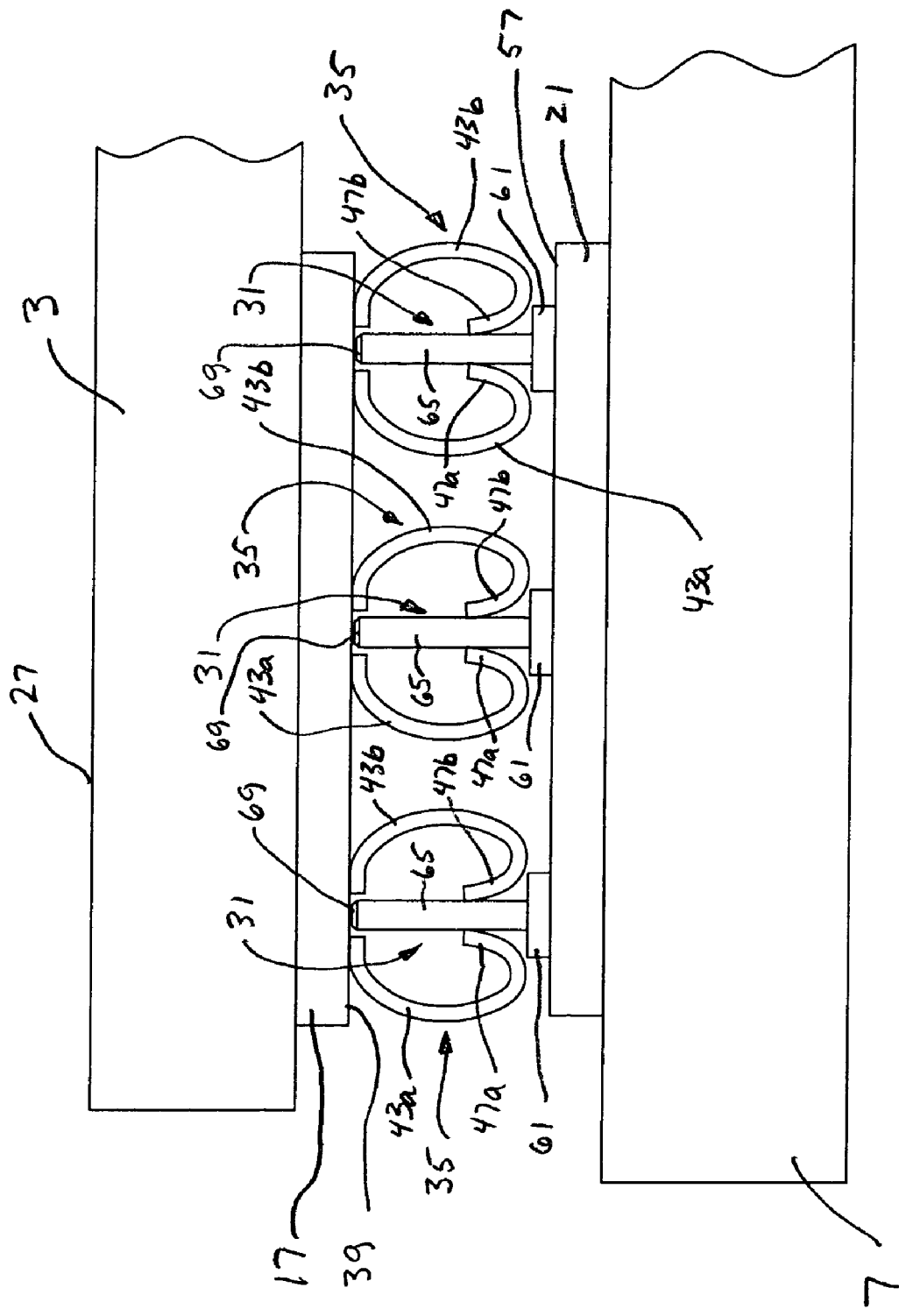

ELECTRICAL CIRCUIT ASSEMBLY WITH MICRO-SOCKET

BACKGROUND OF THE INVENTION

The present invention relates generally to an electrical circuit assembly, and more particularly to an electro-mechanical connection between a microchip and a substrate.

Integrated circuit devices (i.e., microchips, chips, or dies) are typically connected to a substrate (e.g., chip carrier, package, or circuit board) using well-know methods such as Direct Chip Attach (DCA) and wire bonding. DCA uses joining materials such as metallurgical solders or polymeric conductive adhesives that are typically applied to the electrical connection pads (i.e, bond pads) of the chip. The chip can then be electromechanically connected to corresponding bond pads on a substrate by applying heat to melt, or reflow the solder. A protective polymer, called underfill, is applied to the gap between the chip and substrate and then hardened by heating to cause the liquid to polymerize to a solid and provide further bonding between the chip and substrate. In wire bonding, an adhesive or solder is used to attach the chip to the substrate. After chip attachment, fine metal wires are then welded to each chip electrical connection pad and to the corresponding substrate electrical connection pad by using heat or ultrasonic energy. Reference may be made to U.S. Pat. Nos. 5,439,162 and 5,665,654, both of which are incorporated by reference herein for all purposes, for additional background information relating to DCA and wire bonding chip attachment processes. While DCA and wire bonding processes typically result in a reliable chip connection, the connection is considered permanent and does not allow removal and reconnection of the chip. Also, the heat required to reflow the solder or adhesive may damage the microchip and decrease production efficiencies.

Existing electro-mechanical chip connection methods that eliminate thermal bonding processes allow a conventional microchip device to be electrically and mechanically mounted on a substrate of the circuit so that the chip can be removed and reconnected without heating the chip or the substrate. These conventional electro-mechanical connection methods typically include metallized interlocking structures (i.e., hook and loop configurations, interlocking inserts, interlocking micromechanical barbs) located on the electrical connection pads of the microchip and the substrate. Reference may be made to U.S. Pat. Nos. 5,411,400, 5,774,341, and 5,903,059, which are incorporated by reference herein for all purposes, for additional background information relating to existing reconnectable electro-mechanical connections between an integrated circuit device and a substrate. Existing reconnectable chip interface structures have not seen widespread acceptance in the industry because of high manufacturing costs and low reliability of operation.

SUMMARY OF THE INVENTION

Among the several objects of this invention may be noted the provision of an assembly which allows an electro-mechanical connection of a integrated circuit device to a substrate at ambient temperatures; the provision of such an assembly which allows economical manufacture; the provisions of such an assembly which permits simple testing; the provision of such an assembly which allows easy rework; the provisions of such an assembly which provides a reliable electrical and mechanical connection; and the provision of such an assembly that allows easy removal and replacement of the integrated circuit device.

In general, an assembly of the present invention comprises a substrate and an integrated circuit device electrically and mechanically connected to the substrate. At least one electrically conductive connecting element is on one of the substrate and circuit device and at least one socket is on the other of the substrate and circuit device. The socket receives the at least one connecting element and comprises at least two resilient members. The resilient members are biased against the connecting element so that the circuit device and the substrate are held in electrical and mechanical connection by the biasing force of the resilient members against the connecting element.

In another aspect of the invention, the assembly comprises a substrate and an integrated circuit device electrically and mechanically connected to the substrate. At least one electrically conductive socket is on one of the substrate and the circuit device and at least one electrically conductive connecting element is on the other of the substrate and circuit device. The connecting element comprises a body having a headless free end that is received in the socket so that the circuit device and the substrate are held in electrical and mechanical connection by the contact of the connecting element and the socket.

In another aspect of the present invention, the assembly comprises a substrate and an integrated circuit device electrically and mechanically connected to the substrate. At least one electrically conductive socket is on one of the substrate and the circuit device and at least one electrically conductive connecting element is on the other of the substrate and circuit device. The connecting element comprises a body having an axial surface and at least one shoulder extending from the axial surface that is received in the socket so that the circuit device and the substrate are held in electrical and mechanical connection by the contact of the connecting element and the socket.

In yet another aspect of the present invention, the assembly comprises a substrate and an integrated circuit device electrically and mechanically connected to the substrate. At least one electrically conductive socket is on one of the substrate and the circuit device and at least one electrically conductive connecting element is on the other of the substrate and circuit device. The connecting element comprises a conductive ball deposited on the circuit device or the substrate that is received in said socket so that the circuit device and the substrate are held in electrical and mechanical connection by the contact of the ball and the socket.

Other objects and features will be in part apparent and in part pointed out hereinafter.

BRIEF DESCRIPTION OF THE DRAWINGS

FIG. 4 is an enlarged side elevation similar to FIG. 3 but showing the circuit device and the substrate in electrical and mechanical connection;

Corresponding parts are designated by corresponding reference numbers throughout the drawings.

DETAILED DESCRIPTION OF PREFERRED EMBODIMENTS

Figure 1:
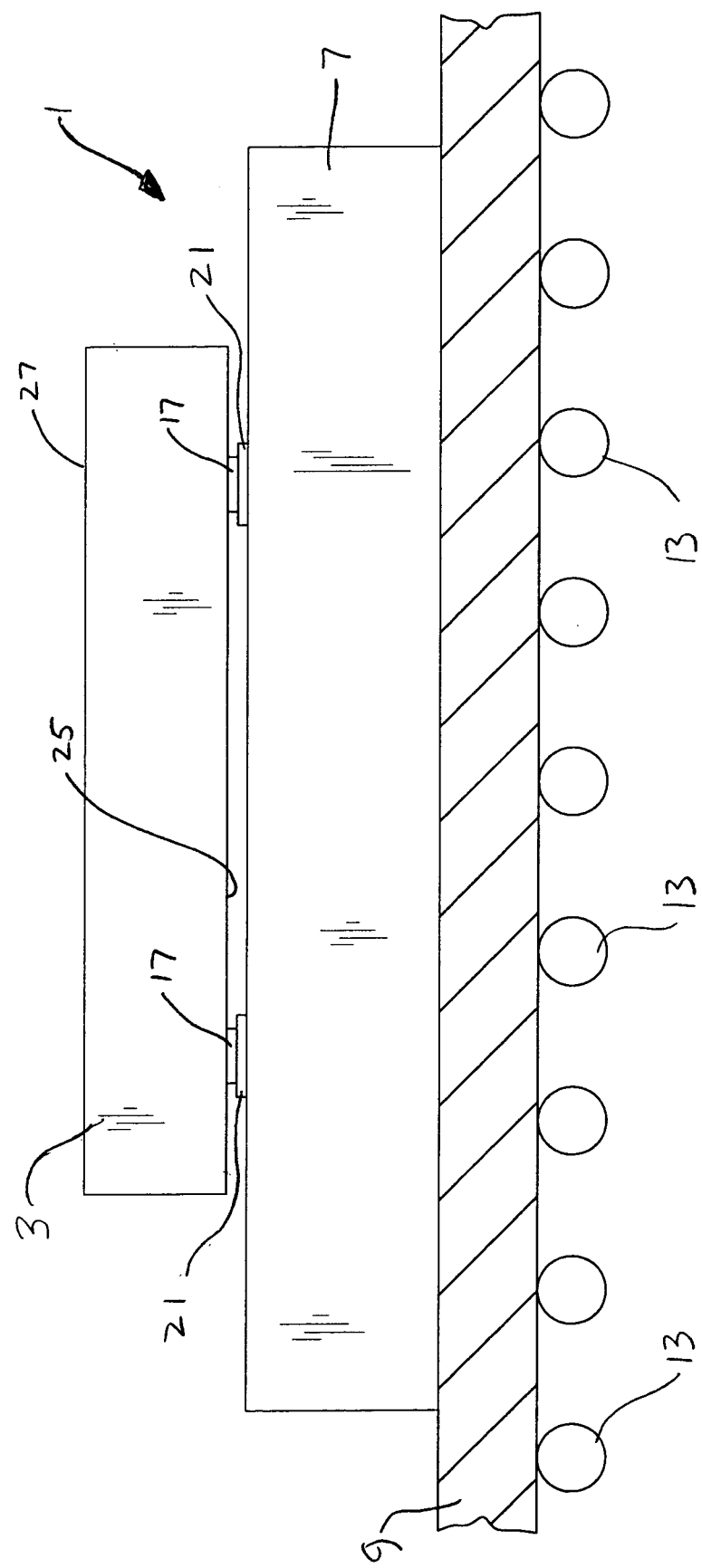
FIG. 1 is an elevation, partially in section, of an electrical circuit assembly of the present invention.

Referring now to the drawings, and more particularly to FIG. 1, an electrical circuit assembly, generally designated 1, comprises an integrated circuit device 3 assembled in accordance with the present invention. In the particular embodiment of FIG. 1, the integrated circuit device 3 is electrically and mechanically attached to a chip carrier substrate 7 that is mounted on a conventional ball grid array 9 having solder balls 13 for electrical connection to a printed circuit board (not shown). It will be understood that the circuit device 3 could be directly attached to the circuit board or could be attached via other conventional connecting substrates (e.g., a pin-grid array or a land grid array). Also, the assembly 1 could include more than one integrated circuit device 3 assembled in accordance with the present invention.

In the illustrated embodiments, the circuit device 3 is shown schematically but it will be understood that each device could comprise any typical integrated circuit device such as a Micro-Electronic Mechanical Systems (MEMS) device, Optoelectronic (OE) device or any other microchip that may be used in an electrical circuit assembly. The chip carrier substrate 7 could comprise a printed circuit board of a finished electronic component (e.g., cell phone), a circuit board configured for testing of integrated circuit devices, or any other electronic circuit substrate that is in electrical and mechanical connection with an integrated circuit device 3.

Figure 2:
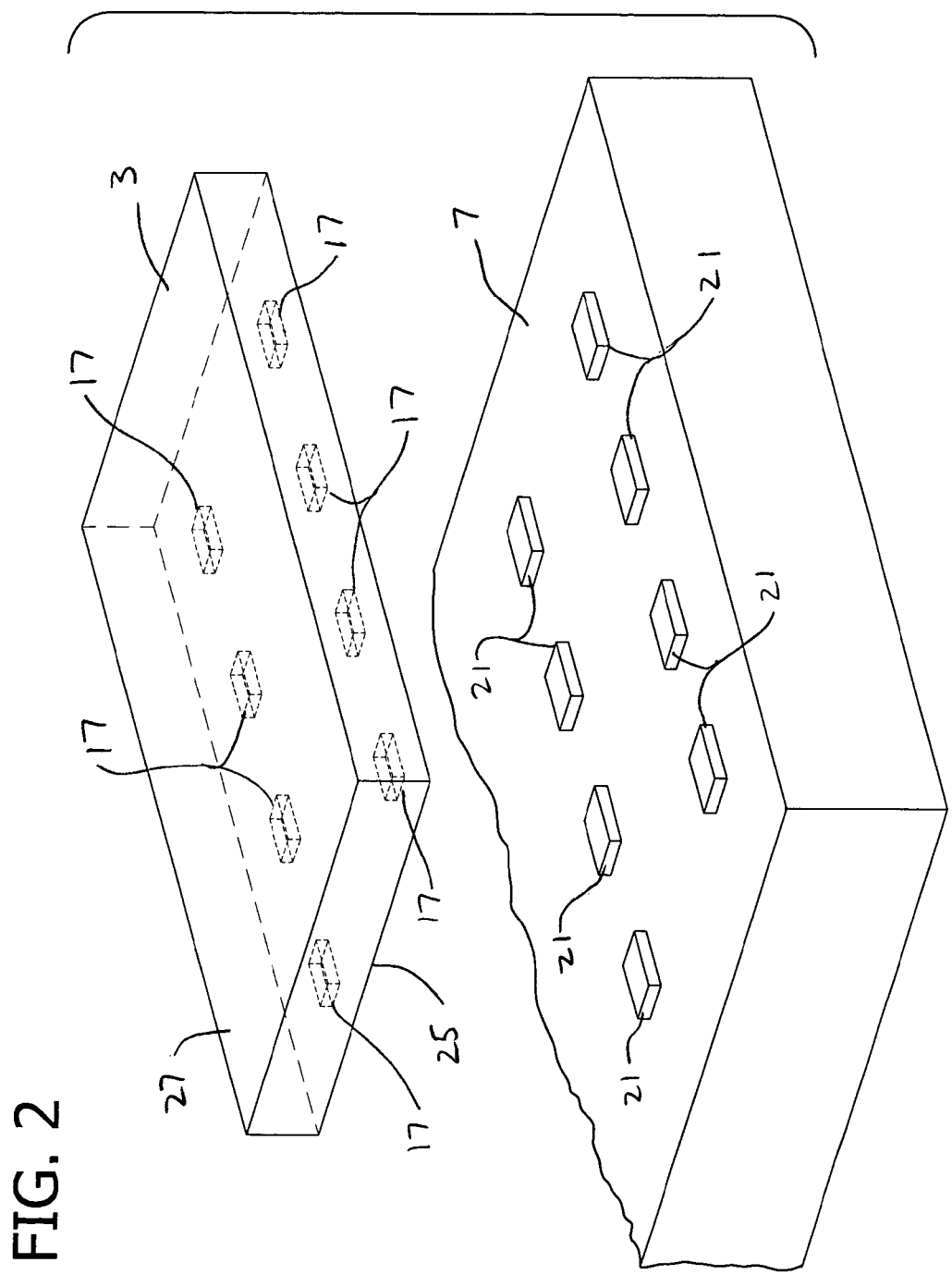
FIG. 2 is an exploded perspective of an integrated circuit device and a substrate of the assembly.

As shown in FIG. 2, the assembly 1 has eight sets of electrical connection pads (i.e., bond pads) 17 on the integrated circuit device 3 for mating with corresponding electrical connection pads 21 on the substrate 7. Each connection pad 17 on the circuit device 3 is a metal pad fabricated on the surface of the device and arranged to contact a corresponding pad 21 on an opposing surface of the chip carrier substrate 7. Each electrical connection pad 17, 21 is electrically connected via conventional means to the circuitry of the microchip 3, or the substrate 7, so that electrical signals can be received and transmitted through the pads. In the illustrated embodiment the connection pads 17 are located near the periphery of the bottom (passive) side 25 of the device 3 but it will be understood that the pads could be located on the top (active) side 27 of the chip. Also, more or less than eight pads 17, 21 could be provided without departing from the scope of this invention. It will be understood that the total number of connection pads 17, 21 on the chip 3 and the substrate 7 will vary depending on the specific technology and application of the integrated circuit device 3 and that hundreds or thousands of external connection terminals may exist on the microchip and the substrate 7. Each connection pad 17 is located for attachment to a corresponding (mating) connection pad 21 on the substrate 7 so that an electrically conductive path is provided between the integrated circuit device 3 and the substrate.

As will be discussed below in more detail, at least one of the electrical connection pads 17, 21 on the chip 3 and the substrate 7 includes at least one electrically conductive connecting element, generally indicated 31, and the other of the chip and the substrate includes at least one socket, generally indicated 35, for receiving a respective connecting element. In the illustrated embodiment (FIG. 3), a plurality of electrically conductive connecting elements 31 are shown as being attached to the substrate 7 and a plurality of sockets 35 are shown as being attached to the integrated circuit device 3. It will be understood that the connecting elements 31 could be attached to the circuit device 3 and the sockets 35 could be attached to the substrate 7 without departing from the scope of this invention.

Figure 3:
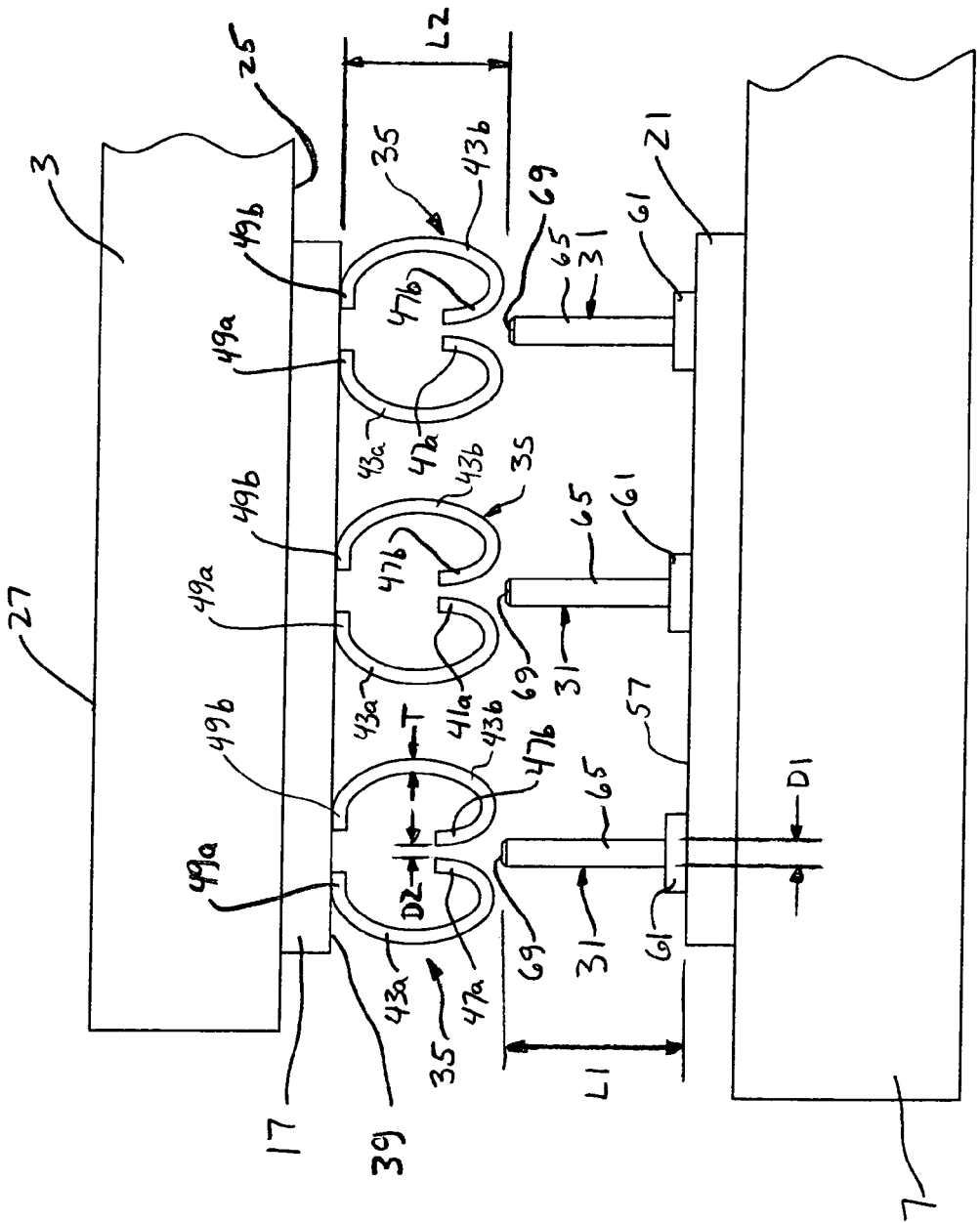
FIG. 3 is an enlarged exploded side elevation of the integrated circuit device and the substrate of the first embodiment.

As shown in FIG. 3, each electrical connection pad 17 on the integrated circuit device 3 has an external surface 39 generally parallel with the device and comprises at least one, and probably more than one, socket 35. Each socket comprises at least two resilient members in the form of adjacent spring fingers, designated 43a and 43b, that cooperate to form the socket. In the illustrated embodiment, each socket 35 comprises two spring fingers 43a, 43b with one of the fingers 43a being generally C-shaped and the adjacent spring finger 43b being a mirror image of the C-shaped finger. Each spring finger 43a, 43b is a curved conductive metal strip that protrudes from the flat external surface 39 of the pad 17. Spring finger 43a has an inturned free end portion 47a that converges near the opposed free end portion 47b of the adjacent spring member 43b. Spring fingers 43a, 43b have respective pad connection portions 49a, 49b attached to the connection surface 39 of the pad 17. In the illustrated embodiment, each pad connection portion 49a, 49b extends generally parallel to the connection surface 39 of the pad 17 and is attached in face-to-face contact with the connection surface. It will be understood that the resilient spring fingers 43a, 43b may have other shapes and configurations without departing from the scope of this invention. In one embodiment, each spring finger 43a, 43b is fabricated on the electrical connection pad 17 and is made from a "stress-engineered" metal or metal alloy (e.g., molybdenum (Mo), molybdenum chromide (MoCr), or nickel zirconium (NiZr)) as disclosed in U.S. Pat. No. 6,560,861, incorporated by reference herein for all purposes. It will be understood that the spring fingers 43a, 43b can be manufactured and attached to the electrical connection pads in accordance with existing circuit fabrication methods such as any of the typical methods disclosed in the '861 patent or any other conventional micro-circuit fabrication method.

Referring again to FIG. 3, each electrical connection pad 21 on the substrate 7 comprises a plurality of spaced apart electrically conductive connecting elements 31 extending from a flat external surface 57 of the pad that is substantially parallel with the substrate. In the embodiment of FIGS. 3 and 4, each electrically conductive connecting element 31 comprises a pin having a base 61 attached to the electrical connection pad 21 and an elongate body 65 that is formed integral with the base. The body 65 of the pin 31 has a headless free end 69 and an external surface with an axial length generally perpendicular to the flat external surface 57 of the connection pad 21. The body 65 of the pin 31 may have the shape of a solid cylinder, for example, or may have a generally tubular shape. It will be understood that the electrically conductive connecting elements 31 may have other shapes and configurations without departing from the scope of this invention. In one embodiment, each pin 31 is made of metal (e.g., gold) and is fabricated from conventional microfabrication processes such as electroplating, sputtering, or LIGA that are well suited for making three-dimensional metal projections bonded to the flat surface 57 of the connection pad 21. Alternatively, the pins 31 may be fabricated as an integral part of the connection pad 21 and comprise any suitable metal or metal alloy (e.g., copper or copper alloys). Each connecting element 31 could comprise a projection made from the same semi-conductor material as the substrate 7 (e.g., silicon, ceramic, or any other suitable semi-conductor material) by using conventional fabrication processes such as microelectronic photolithographic techniques (i.e., LIGA processes or surface micromachining and etching) prior to metallizing the connection pad 21. After fabrication of the substrate 7, the pins 31 and connection pads 21 on the substrate may be metallized by conventional processes such as vacuum metal deposition, electroless plating, or electrolytic plating to form the electrically conductive chip connection pad that comprises the metallized pins and the flat external surface 57 surrounding the pins.

As seen in FIGS. 3 and 4, the integrated circuit device 3 is aligned with the substrate 7 such that the pins 31 on the substrate are received in the sockets 35 to form an electrical and mechanical connection between the device and the substrate. More specifically, the pin body 65 is sized to fit between the opposed spring fingers 43a, 43b of the socket 35 so that the resilient spring fingers flex outward to receive the pin. The biasing force of the spring fingers 43a, 43b causes the fingers to press against the axial exterior surface of the body 65 to form a secure mechanical and electrical connection between the circuit device and the substrate. The contact of the axial surface of each pin 31 and the exterior axial surface of each resilient spring finger 43a, 43b creates an electrical connection between the circuit device 3 and the substrate 7. It will be understood that the device 3 and the substrate 7 may also be held in contact by surface attractive forces (e.g., stiction forces) that are common in microchip connections. Surface attractive forces common in microchip connections include friction or chemical adhesion, electrostatic forces, and capillary forces between the components of the electrical circuit assembly. The spring and surface attraction forces created by the insertion of the pins 31 in the sockets 35 provide a connection force which is sufficient to hold the integrated circuit device 3 in a fixed position relative to the substrate 7. However, the connection force holding the integrated circuit device 3 and substrate 7 in electro-mechanical connection is small enough so that the device may be removed, replaced and repositioned on the substrate without the need for extensive rework of the connection pads 17, 21, pins 31, or sockets 35. Also, the resiliency of the spring fingers 43a, 43b allows the sockets 35 to return to their disengaged (relaxed) state shown in FIG. 3 upon removal of the electrical connecting elements 31 so that the sockets have an extended life and can be reused for subsequent electro-mechanical connections. The device 3 may be mounted on the substrate 7 by insertion of the pins 31 into the sockets during final component assembly or during testing of the integrated circuit device 3. In the embodiment of FIGS. 3 and 4, the integrated circuit device 3 may be attached to the substrate 7 such that the pins 31 on the substrate 7 are fully inserted into the sockets 35 on the circuit device (i.e., at least one of the free ends 69 of the pins contacts the flat surface 57 of the connection pad 21 on the substrate). Alternatively, the circuit device 3 could be spaced away from the substrate 7 by stops (not shown) on the device that contact the substrate to limit the spacing of the chip relative to the substrate and also assure that the chip and substrate are aligned in parallel planes.

Figure 3A:
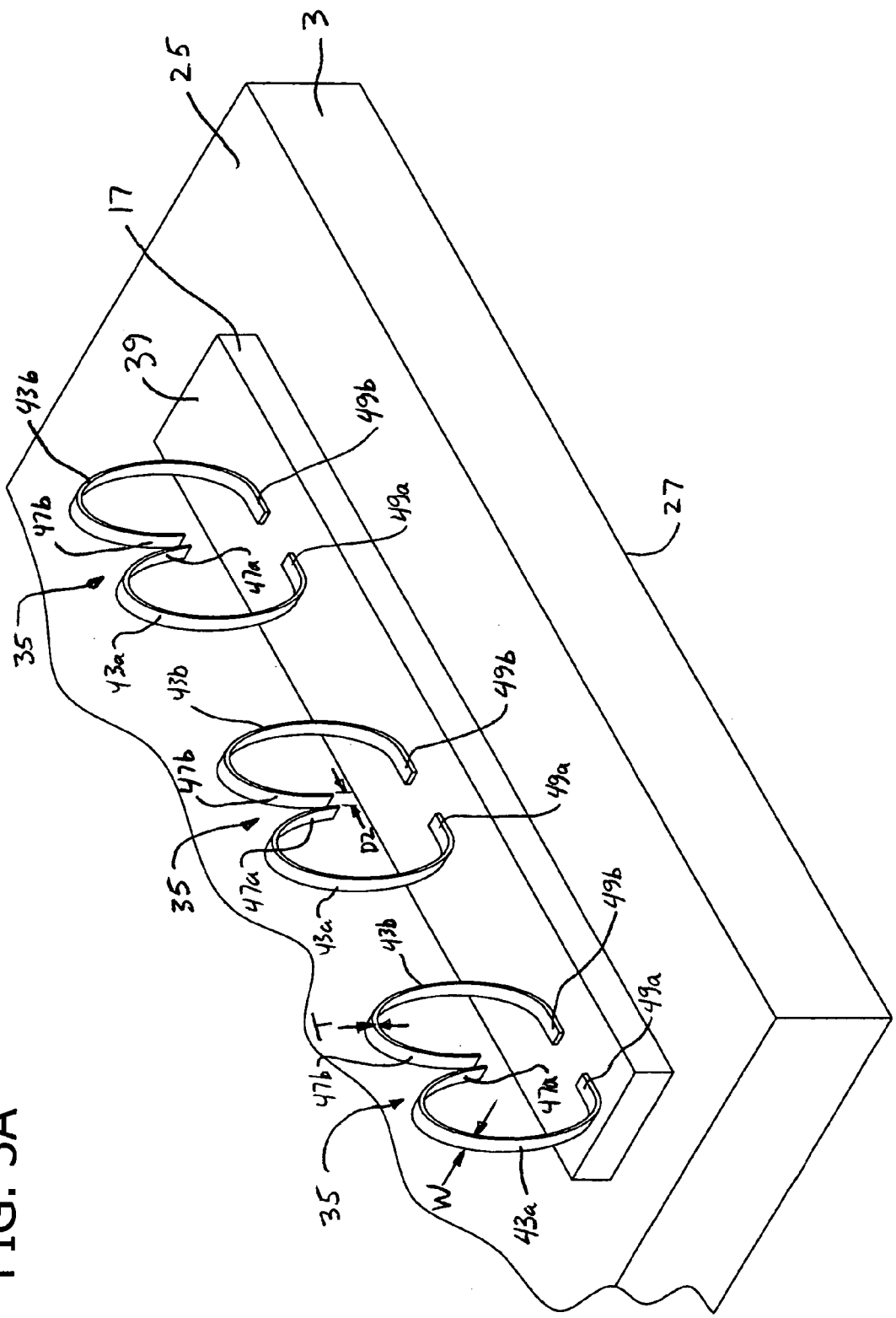
FIG. 3A is an enlarged perspective of the integrated circuit device of the first embodiment.

In one exemplary embodiment illustrated in FIG. 3, each pin 31 may have a length L1 of approximately 1 millimeter and a diameter D1 of approximately 0.1 millimeter with approximately 1 millimeter of spacing between adjacent pins. As shown in FIGS. 3 and 3A, each spring finger 43a, 43b may have a thickness T of approximately 15 microns, a length L2 of approximately 50 microns, and a width W of approximately 5 microns. Each spring finger may have a distance D2 of approximately 0.4 millimeter between the opposed free end portions 47a, 47b of adjacent spring fingers 43a, 43b. It will be understood that the electrically conductive connecting elements 31 and sockets 35 described above can have other dimensions and can be otherwise arranged without departing from the scope of this invention. The amount of contact surface area between pins 31 and the spring fingers 43a, 43b is directly proportional to the electrical conductivity between chip 3 and the substrate 7. The size of the pins 31 and the spring fingers 43a, 43b, the spacing between the spring fingers, and the amount of curvature of the spring fingers is directly proportional to the mechanical force connecting the integrated circuit device 3 and the substrate 7. The number of pins 31 and sockets 35 and their dimensional configurations will vary based on the specific application and the amount of electrical conductivity and mechanical connection force required. For example, high current applications may require a larger number of pins 31 and sockets 35 so that a higher amount of current can be transferred between the circuit device 3 and the substrate 7.

In operation, an integrated circuit assembly 1 of the present invention is created by electrically and mechanically connecting the integrated circuit device 3 to the chip carrier substrate 7. The circuit device 3 is mechanically and electrically connected to the substrate 7 by the insertion of the pins 31 on the substrate into respective sockets 35 on the circuit device. The spring force of the spring fingers 43a, 43b biased against the pins 31 creates a secure electrical and mechanical connection between the integrated circuit device 3 and the substrate 7. The chip carrier substrate 7 receives electrical signals from a printed circuit board (not shown), or other components of an electrical circuit, that are transferred to the integrated circuit device 3 through the contact of the electrically conductive pins 31 with the electrically conductive spring fingers 43a, 43b of each socket 35. Alternatively, the assembly 1 may be configured with the pins 31 on the substrate 7 and the sockets 35 on the integrated circuit device 3 so that the electrical and mechanical connection between the device and the substrate is established through insertion of the pins into the sockets.

Figure 5:
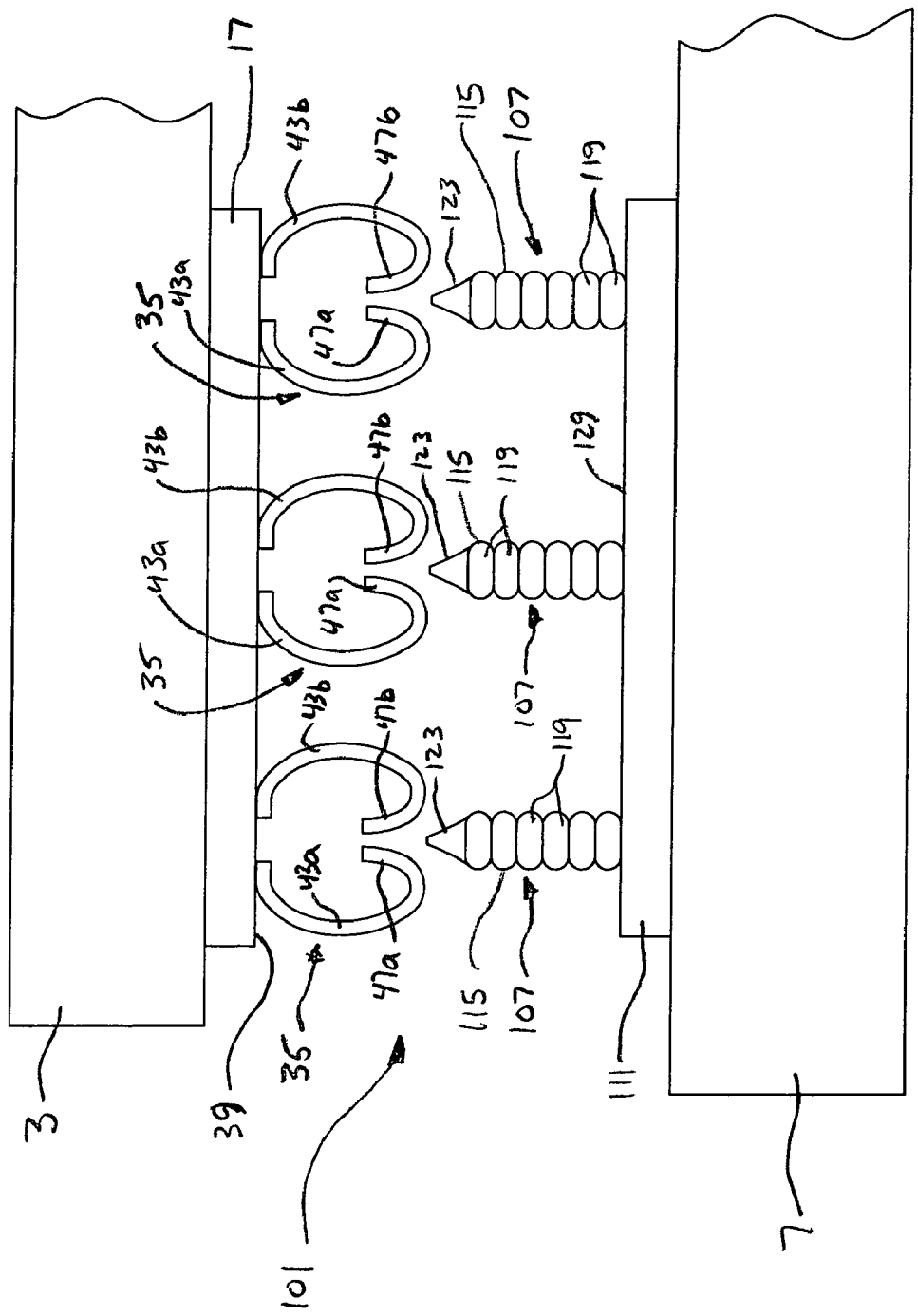
FIG. 5 is an enlarged exploded side elevation of an integrated circuit device and substrate of a second embodiment of the present invention.
Figure 6:
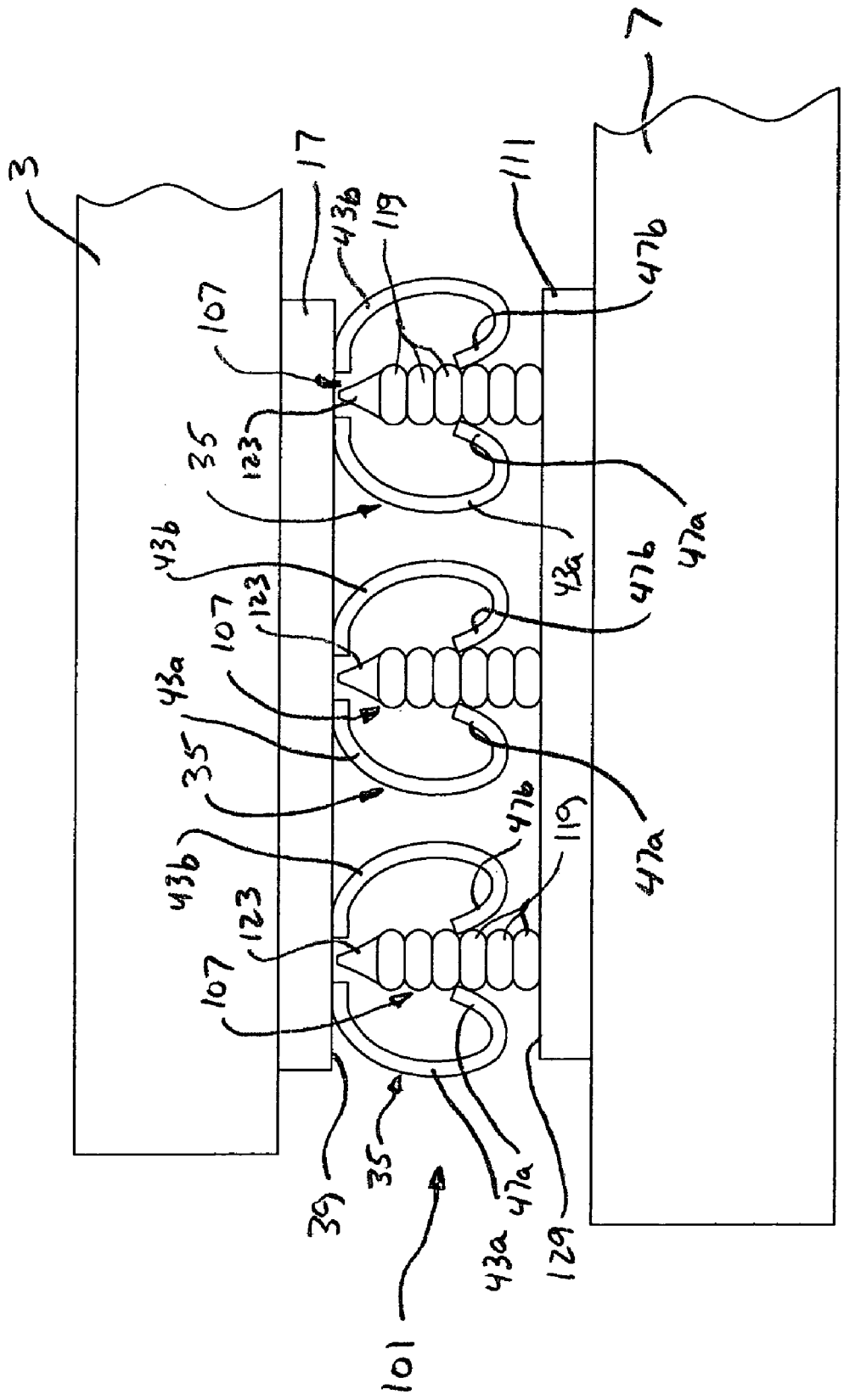
FIG. 6 is an enlarged side elevation similar to FIG. 5 but showing the circuit device and the substrate in electrical and mechanical connection.

FIGS. 5 and 6 show a second embodiment of the present invention, generally designated 101, which provides for a locking connection of the integrated circuit device 3 with the substrate 7 so that circuit device can be spaced away from the substrate a desired (selected) distance and held in a fixed position relative to the substrate. This embodiment 101 is particularly useful when the circuit device 3 is an optoelectronic or optical-MEMS device that requires vertical alignment for the transfer of light between adjacent devices. In the embodiment of FIGS. 5 and 6, each electrically conductive connecting element 107 comprises a stud bump attached to the electrical connection pad 111 having a body 115 that comprises multiple protruding shoulder portions 119 and a generally conical tip 123. In one embodiment, each stud bump 107 has six shoulder portions 119, but it will be understood that each stud bump could have at least one or more than six shoulder portions without departing from the scope of this invention. Each stud bump 107 is formed on the surface 129 of the substrate electrical connection pad 111 by conventional fabrication methods and is adhered to the connection pad by thermocompression or adhesive bonding. Reference is made to U.S. Pat. No. 6,214,642, incorporated by reference herein for all purposes, for information relating to conventional stud bumping processes. Each stud bump 107 may be made from suitable conductive metal such as gold or aluminum and may include a layer of solder or conductive adhesive on the outer surface of the stud bump to enhance the connection between the stud bump and the socket 35. The layer of solder or conductive adhesive is particularly useful in enhancing the mechanical connection force between the circuit device 3 and the substrate 7 in electronic assemblies (e.g., cell phones) that require a high amount of drop shock resistance.

As seen in FIG. 6, insertion of the stud bumps 107 on the substrate into respective sockets 35 on the integrated circuit device creates a mechanical and electrical connection between the circuit device 3 and the substrate 7. As in the previous embodiment, the biasing force of the spring fingers 43a, 43b against the stud bumps 107 provides a mechanical force holding the integrated circuit device 3 and the substrate 7 in electrical and mechanical connection. In the embodiment of FIGS. 5 and 6, the resilient members 43a, 43b engage the shoulders 119 of the stud bumps 107 to provide an additional latching force that supplements the biasing force of the spring fingers against the connecting elements. The position of the integrated circuit device 3 relative to the substrate 7 is fixed by the spring biasing force and by the interlocking force created by the engagement of the inturned free end portions 47a, 47b of the spring fingers 43a, 43b with the protruding shoulders 119 of the stud bumps 107. In one exemplary embodiment, each shoulder 119 has an axial length of approximately 0.1 millimeter to provide a total of approximately 0.6 millimeter of adjustable length of the stud bump 107. The total range of adjustable length of each stud bump 107 as well as the axial length of each shoulder 119 may vary without departing from the scope of this invention. As in the previous embodiment, the connecting force holding the circuit device 3 in electromechanical connection with the substrate 7 is large enough to provide a secure and reliable connection and small enough to allow the circuit device to be easily removed from the substrate and reconnected.

Figure 7:
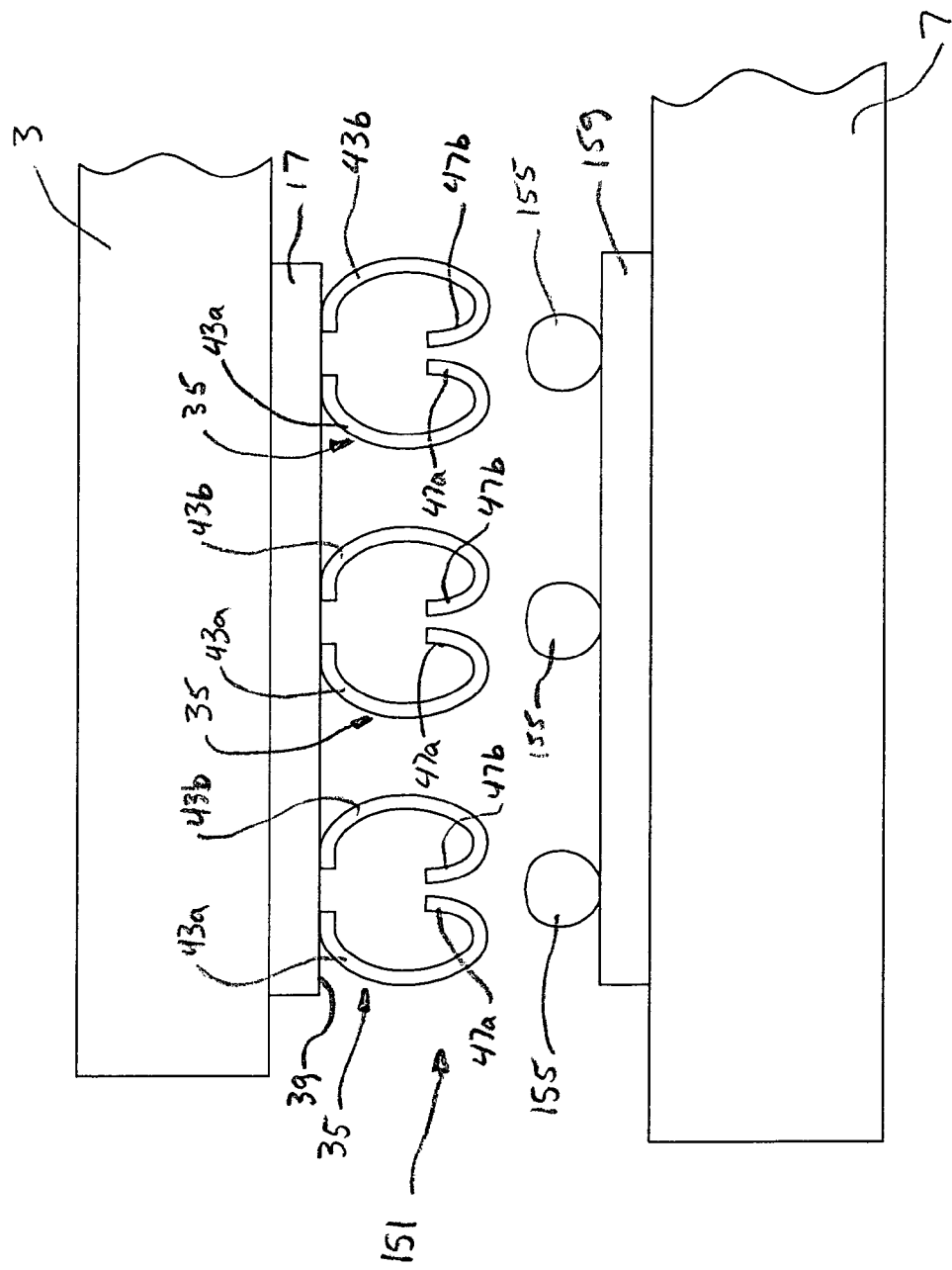
FIG. 7 is an enlarged exploded side elevation of an integrated circuit device and substrate of a third embodiment of the present invention.
Figure 8:
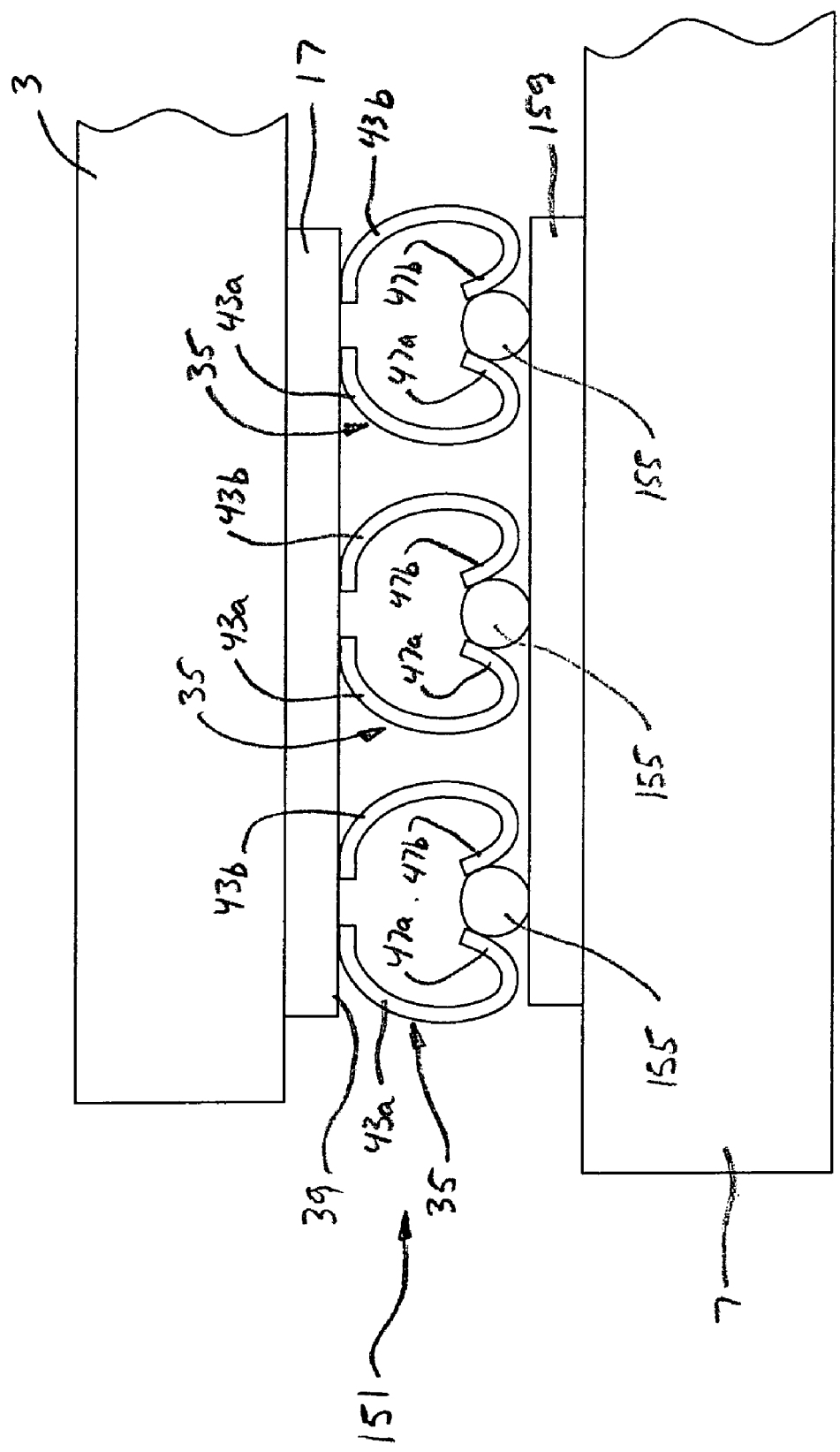
FIG. 8 is an enlarged side elevation similar to FIG. 7 but showing the circuit device and the substrate in electrical and mechanical connection.

FIGS. 7 and 8 illustrate a third embodiment of the present invention, generally designated 151. Each electrically conductive connecting element 155 of this embodiment comprises an electrically conductive ball affixed to the electrical connection pad 159 of the substrate 7. As seen in FIG. 8, the integrated circuit device 3 is electrically and mechanically attached to the substrate by the engagement of each ball 155 with the spring fingers 43a, 43b of a respective socket 35. As in the previous embodiments, the resilient force of the spring fingers 43a, 43b creates a mechanical holding force of sufficient magnitude to allow the releasable attachment of the circuit device 3 to the substrate 7. It will be understood that the conductive balls 155 could comprise solder spheres made of conventional solder materials (e.g., tin, lead, copper, etc.) that are frequently used in micro-circuit interconnects and are commercially available from Cookson Electronics—Semiconductor Products of Alpharetta, Ga. Alternatively, the electrically conductive connecting elements 155 of this embodiment could comprise balls of electrically conductive adhesive such as the type sold under the trade name POLYSOLDER® also sold by Cookson Electronics—Semiconductor Products. In this embodiment, the biasing force of the spring fingers 43a, 43b can be supplemented by heating the assembly to the corresponding reflow temperature of the conductive ball 155 and allowing the ball to cool so that the solder or conductive adhesive is activated to increase the strength of the connection between the sockets 35 and the connecting elements. In the embodiment of FIGS. 7 and 8, removal and reattachment of the circuit device 3 requires the additional step of heating the solder or adhesive ball 155 to its respective reflow temperature so that the circuit device can be removed from the substrate 7.

In view of the above, it will be seen that the several objects of the invention are achieved and other advantageous results attained. The biasing force of the sockets 35 against the electrically conductive connecting elements 31 allows for secure assembly and attachment of the integrated circuit device 3 to the substrate 7. The connecting elements 31 and the sockets 35 are configured to allow the device 3 to be easily removed from a testing substrate 7 and reconnected to an electronic device substrate without extensive rework. Also, the fit between the connecting elements 31 and the sockets 35 allows easy removal, repair and replacement of an integrated circuit device 3 in a final assembly.

As various changes could be made in the above constructions without departing from the scope of the invention, it is intended that all matter and dimensions contained in the above description or shown in the accompanying drawings shall be interpreted as illustrative and not in a limiting sense. For example, the electrically conductive connecting elements 31 could have alternative shapes and sizes that allow the biasing force of the sockets 35 against the connecting elements to hold the integrated circuit device 3 in electrical and mechanical contact with the substrate 13 or that provide a supplemental latching force that increases the mechanical holding force between the device and the substrate.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

What is claimed is:

1. An electrical circuit assembly, comprising
a substrate having a first electrical connection pad,
an integrated circuit device having a second electrical connection pad,
at least one electrically conductive connecting element attached to one of said first and second connection pads prior to assembly of the substrate and the integrated circuit device,
at least one socket comprising at least two resilient members attached to the other of said first and second connection pads prior to assembly of the substrate and the integrated circuit device,
said at least one socket being adapted to receive said at least one electrically conductive connecting element when the substrate and integrated circuit device are assembled such that the at least two resilient members of the socket exert a biasing force against said at least one electrically conductive connecting element to hold the substrate and integrated circuit device in electrical and mechanical connection without the need for a connector separate from the substrate and integrated circuit device, said assembly being free of any containment structure between the substrate and the integrated circuit device surrounding the at least two resilient members.

2. An assembly as set forth in claim 1 wherein said at least one electrically conductive connecting element is on the substrate and at least one resilient socket is on the circuit device.

3. An assembly as set forth in claim 1 wherein said at least one electrically conductive connecting element comprises a pin projecting from a surface of the substrate or circuit device.

4. An assembly as set forth in claim 1 wherein said integrated circuit device is a MEMS device.

5. An assembly as set forth in claim 1 wherein said integrated circuit device is a chip scale package.

6. An assembly as set forth in claim 1 wherein said integrated circuit device is an optoelectronic device.

7. An assembly as set forth in claim 1 wherein said substrate is a test substrate for performing testing of the integrated circuit device.

8. An assembly as set forth in claim 1 wherein said substrate is a printed circuit board for an electronic device.

9. An assembly as set forth in claim 1 wherein said at least one electrically conductive connecting element comprises a solder ball.

10. An assembly as set forth in claim 1 wherein said at least two resilient members comprise opposed spring fingers electrically connected to the substrate or the circuit device.

11. An assembly as set forth in claim 10 wherein said spring fingers have inturned free end portions which form an opening for receiving said at least one electrically conductive connecting element.

12. An assembly as set forth in claim 11 wherein said spring fingers are C-shaped.

13. An assembly as set forth in claim 1 wherein said at least one electrically conductive connecting element has a body with an axial length extending from a first end of the connecting element connected to the substrate or circuit device to a second free end.

14. An assembly as set forth in claim 13 wherein the body of said at least one electrically conductive connecting element is headless.

15. An assembly as set forth in claim 14 wherein said body is cylindric and of substantially uniform diameter throughout the axial length of the connecting element.

16. An assembly as set forth in claim 13 wherein said body comprises at least one shoulder that engages the resilient members of the socket to provide an interlocking force supplementing the biasing force of the resilient members to hold the circuit device and the substrate in electrical contact.

17. An assembly as set forth in claim 1 wherein said at least one electrically conductive connecting element comprises a stud bump made from metal deposited on the electrical connection pad of the substrate or circuit device.

18. An assembly as set forth in claim 17 wherein said metal is gold.

19. An assembly as set forth in claim 1 further comprising a bonding agent on either of the electrically conductive connecting element or the socket to strengthen the electrical and mechanical connection between the connecting element and the socket.

20. An assembly as set forth in claim 19 wherein said bonding agent is a solder alloy.

21. An assembly as set forth in claim 19 wherein said bonding agent is a conductive adhesive.

22. An electrical circuit assembly, comprising
a substrate having a first electrical connection pad,
an integrated circuit device having a second electrical connection pad,
at least one socket attached to one of said first and second connection pads prior to assembly of the substrate and the integrated circuit device,
at least one electrically conductive connecting element attached to the other of said first and second connection pads prior to assembly of the substrate and the integrated circuit device, the connecting element comprising a body having a headless free end,
said at least one electrically conductive connecting element being received in said at least one socket when the substrate and integrated circuit device are assembled such that the socket exerts a biasing force against said body to hold the substrate and integrated circuit device in electrical and mechanical connection without the need for a connector separate from the substrate and integrated circuit device, said assembly being free of any containment structure between the substrate and the integrated circuit device surrounding the at least one socket.

23. An assembly as set forth in claim 22 wherein said electrical conductive connecting element comprises a pin projecting from a surface of the substrate or the circuit device.

24. An assembly as set forth in claim 22 wherein said socket comprises at least two resilient members biased against said connecting element so that the circuit device and the substrate are held in electrical and mechanical connection by the biasing force of the resilient members against the connecting element.

25. An assembly as set forth in claim 24 wherein said at least two resilient members comprise opposed spring fingers electrically connected to the substrate or the circuit device, the spring fingers having inturned free end portions forming an opening for receiving said at least one electrically conductive connecting element.

26. An electrical circuit assembly, comprising
a substrate having a first electrical connection pad,
an integrated circuit device having a second electrical connection pad,
at least one socket directly attached to one of said first and second connection pads prior to assembly of the substrate and the integrated circuit device,
at least one electrically conductive connecting element attached to the other of said first and second connection pads prior to assembly of the substrate and the integrated circuit device, the connecting element comprising a body having an axial surface and at least one shoulder extending from the axial surface,
said at least one electrically conductive connecting element being received in said at least one socket when the substrate and integrated circuit device are assembled such that the socket exerts a biasing force against said at least one shoulder to hold the substrate and integrated circuit device in electrical and mechanical connection without the need for a connector separate from the substrate and integrated circuit device, said assembly being free of any containment structure between the substrate and the integrated circuit device surrounding the at least one socket.

27. An assembly as set forth in claim 26 wherein said electrical conductive connecting element comprises a stud bump projecting from a surface of the substrate or the circuit device.

28. An assembly as set forth in claim 27 wherein said stud bump comprises metal deposited on an electrical connection pad of the substrate or the circuit device.

29. An assembly as set forth in claim 26 wherein said socket comprises at least two resilient members biased against said at least one connecting element so that the circuit device and the substrate are held in electrical and mechanical connection by the biasing force of the resilient members against the connecting element.

30. An assembly as set forth in claim 29 wherein said at least two resilient members comprise opposed spring fingers electrically connected to the substrate or the circuit device, the spring fingers having inturned free end portions forming an opening for receiving said at least one electrically conductive connecting element.

31. An electrical circuit assembly, comprising
a substrate having a first electrical connection pad,
an integrated circuit device having a second electrical connection pad,
at least one socket attached to one of said first and second connection pads prior to assembly of the substrate and the integrated circuit device,
at least one electrically conductive connecting element attached to the other of said first and second connection pads prior to assembly of the substrate and the integrated circuit device, the connecting element comprising a conductive sphere deposited on the other of said first and second connection pads,
said conductive sphere being received in said socket when the substrate and integrated circuit device are assembled such that the at least one socket exerts a biasing force against said conductive sphere to hold the substrate and integrated circuit device in electrical and mechanical connection without the need for a connector separate from the substrate and integrated circuit device, said assembly being free of any containment structure between the substrate and the integrated circuit device surrounding the at least one socket.

32. An assembly as set forth in claim 31 wherein said conductive ball comprises a solder sphere.

33. An assembly as set forth in claim 31 wherein said conductive ball comprises a conductive adhesive.

34. An assembly as set forth in claim 31 wherein said socket comprises at least two resilient members biased against said connecting element so that the circuit device and the substrate are held in electrical and mechanical connection by the biasing force of the resilient members against the connecting element.

35. An assembly as set forth in claim 34 wherein said at least two resilient members comprise opposed spring fingers electrically connected to the substrate or the circuit device, the spring fingers having inturned free end portions forming an opening for receiving said at least one electrically conductive connecting element.

36. An electrical circuit assembly comprising
a substrate,
an integrated circuit device electrically and mechanically connected to the substrate,
at least one electrically conductive connecting element on the substrate,
at least one socket on the circuit device for receiving said at least one connecting element, said socket comprising at least two resilient members biased against said connecting element so that the circuit device and the substrate are held in electrical and mechanical connection by the biasing force of the resilient members against the connecting element.

37. An electrical circuit assembly, comprising
a substrate having a first electrical connection pad with a connection surface,
an integrated circuit device having a second electrical connection pad with a connection surface,
at least one electrically conductive connecting element non-releasably attached to the connection surface of one of said first and second connection pads prior to assembly of the substrate and the integrated circuit device,
at least one socket comprising at least two resilient members having pad connection portions directly and non-releasably attached to the connection surface of the other of said first and second connection pads prior to assembly of the substrate and the integrated circuit device, said pad connection portions extending generally parallel to said connection surface of the other of said first and second connection pads and being attached in face-to-face contact with said connection surface,
said at least one socket being adapted to receive said at least one electrically conductive connecting element when the substrate and integrated circuit device are assembled such that the at least two resilient members of the socket exert a biasing force against said at least one electrically conductive connecting element to hold the substrate and integrated circuit device in electrical and mechanical connection.

38. An assembly as set forth in claim 37 wherein each of said at least two resilient members is formed from a flat metal strip.

39. An assembly as set forth in claim 38 wherein said flat metal strip is bent generally into the shape of a C.

40. An assembly as set forth in claim 39 wherein said at least two resilient members have inturned free end portions which form an opening for receiving said at least one electrically conductive connecting element.

* * * * *